United States Patent [19]

Tsujimoto et al.

[11] Patent Number: 4,916,478
[45] Date of Patent: Apr. 10, 1990

[54] METHOD FOR THE FORMATION OF IMAGES AND AN APPARATUS FOR THE SAME

[75] Inventors: Yoshiharu Tsujimoto, Yamatokohriyama; Kunio Ohashi, Nara; Yoshikazu Fujiwara, Shiki; Hiromu Sasaki; Syoichi Nagata, both of Yamatokohriyama, all of Japan

[73] Assignee: Sharp Kabushiki Kaisha, Osaka, Japan

[21] Appl. No.: 217,258

[22] Filed: Jul. 11, 1988

[30] Foreign Application Priority Data

Jul. 10, 1987 [JP] Japan .................... 62-173707
Aug. 25, 1987 [JP] Japan .................... 62-210887
Aug. 25, 1987 [JP] Japan .................... 62-210891

[51] Int. Cl.$^4$ .................... G03B 27/32; G03B 27/52
[52] U.S. Cl. .................... 355/27; 355/72; 355/77
[58] Field of Search .................... 355/27, 28, 32, 37, 355/72, 77; 430/138

[56] References Cited

U.S. PATENT DOCUMENTS 4,399,209 8/1983 Sanders et al. .................... 430/138
4,806,984 2/1989 Asane .................... 355/77 X

FOREIGN PATENT DOCUMENTS 58-88739  5/1983 Japan .
59-149343 8/1984 Japan .

Primary Examiner—Michael L. Gellner
Assistant Examiner—Brian W. Brown
Attorney, Agent, or Firm—Spencer & Frank

[57] ABSTRACT

A sheet-exposure stand supporting a photosensitive sheet on its sheet-placement surface, the photosensitive sheet being composed of a light-permeable substrate that is coated with pressure-rupturable capsules that contain chromogenic materials and photosensitive materials that are hardened when illuminated with light, and the sheet-placement surface being coated with or made of a light-reflective substance, and a method for the formation of images using the same.

16 Claims, 12 Drawing Sheets log E (The Amount of Light Used to Expose a Photosensitive Sheet)

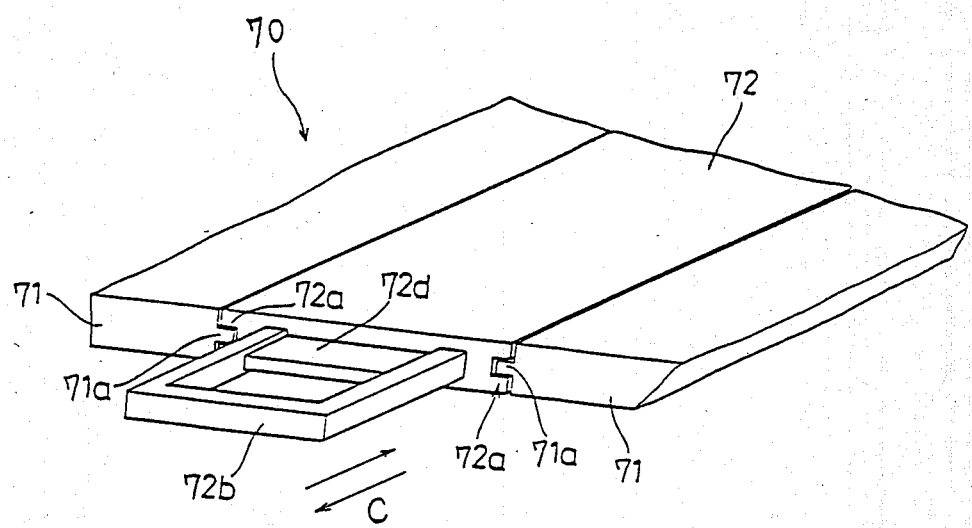
Fig. 10
Fig. 11
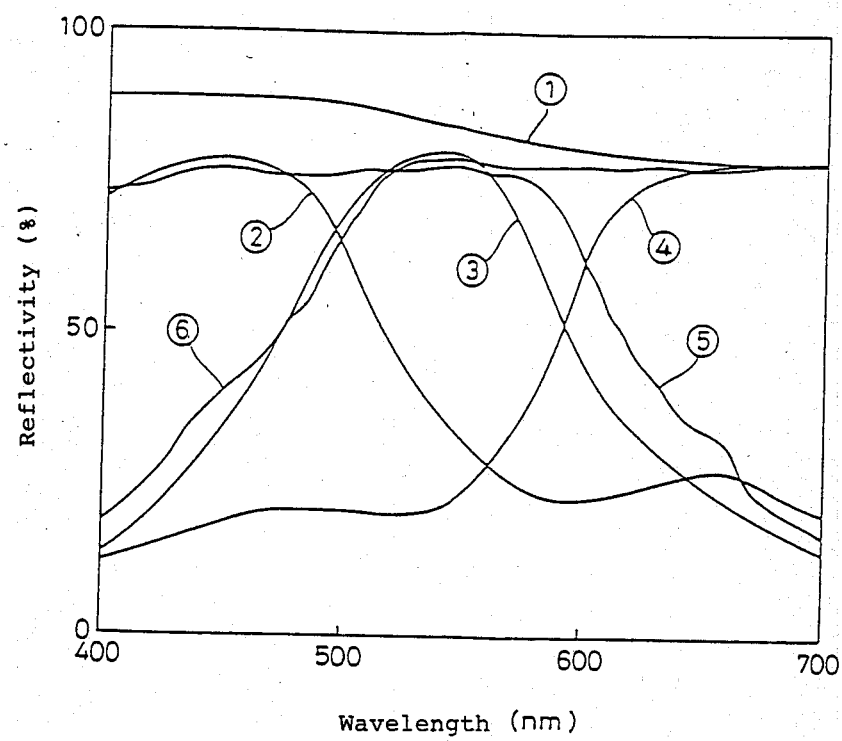

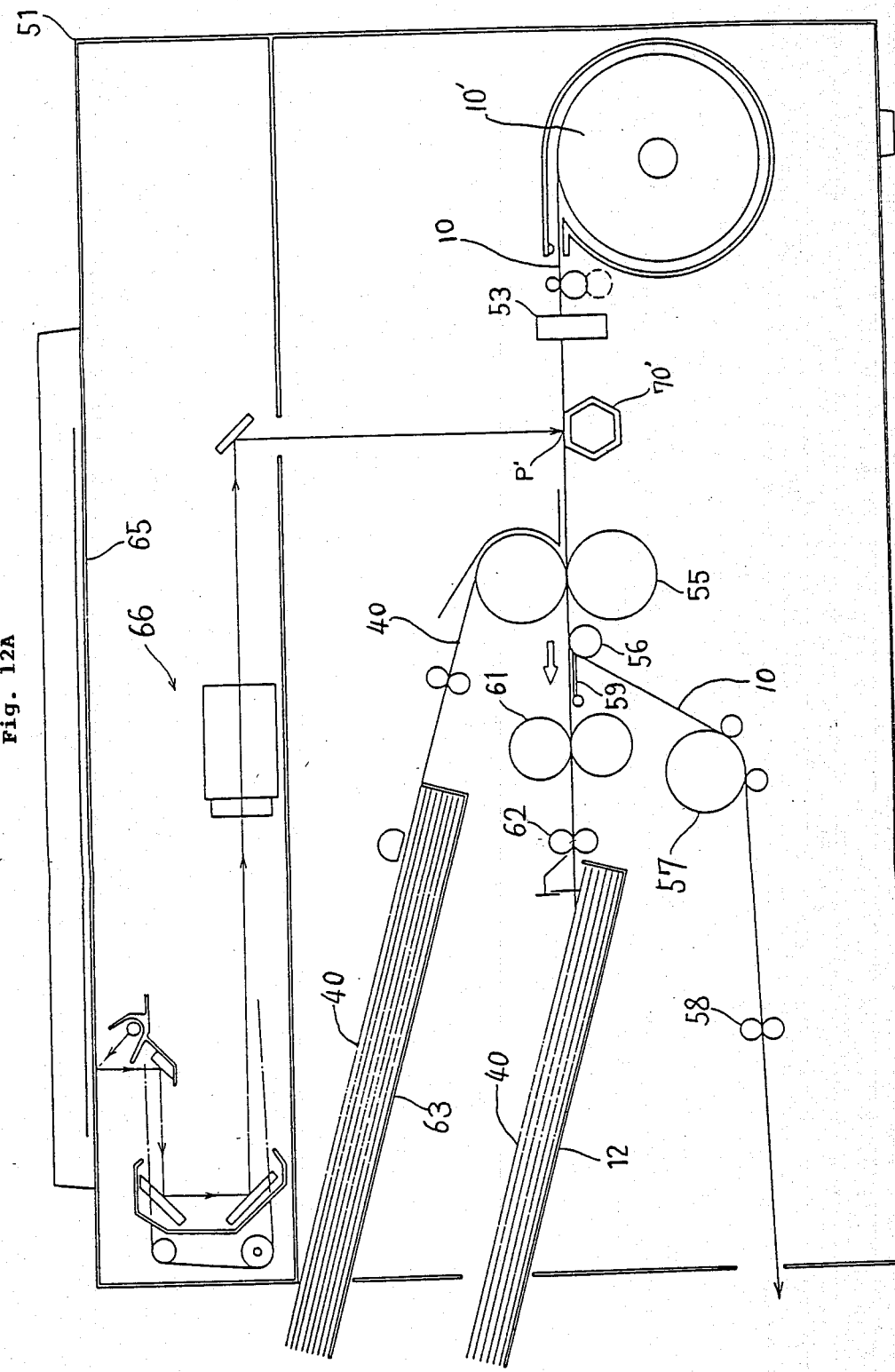

METHOD FOR THE FORMATION OF IMAGES AND AN APPARATUS FOR THE SAME

BACKGROUND OF THE INVENTION

1. Field of the Invention

This invention relates to a method for the formation of images using a photosensitive sheet that is composed of a light-permeable sheet substrate and pressure-rupturable capsules coated on the light-permeable sheet substrate, the said capsules containing a specific chromogenic material and a photosensitive material therein, and to an apparatus that uses this method.

2. Description of the Prior Art

Japanese Laid-Open Patent Application Nos. 58-88739 and 59-149,343 disclose methods for the formation of images that make use of photosensitive sheets, which are composed of a light-permeable substrate in the shape of a sheet and pressure-rupturable capsules coated on the substrate. The capsules contain a specific chromogenic material and a photosensitive material.

When this kind of photosensitive sheet is exposed to light from or through a certain image, only the pressure-rupturable capsules that were exposed on the top of the photosensitive sheet harden, resulting in a latent image on the photosensitive sheet that corresponds to the image from or through which the sheet was exposed to light. When the photosensitive sheet on which a latent image is formed is brought together with an image-receiving sheet that is coated with developing materials that give rise to colors with the chromogenic material inside the pressure-rupturable capsules, the pressure-rupturable capsules that are still not hardened rupture, and the chromogenic material contained in these pressure-rupturable capsules flows out. Then there is a reaction between the chromogenic material and the developing materials of the image-receiving sheet, which gives rise to color in the said chromogenic material, which forms an image on the image-receiving sheet.

It is also possible to form colored images by the use of the above-mentioned photosensitive sheet. For example, three kinds of photosensitive materials hardened by light are used that are hardened by wavelengths in the red, green, or blue regions, and one of the three kinds of photosensitive materials and a chromogenic material that gives rise to a color complementary to that color of light are contained in the same pressure-rupturable capsules. In this way, three kinds of pressure-rupturable capsules are prepared. That is, a material that is hardened by light with wavelengths in the blue region of light and a chromogenic material that gives rise to yellow, the color complementary to blue, are contained in some pressure-rupturable capsules (called Y capsules below); a material that is hardened by light with wavelengths in the green region of light and a chromogenic material that gives rise to magenta, the color complementary to green (called M capsules below); and a material that is hardened by light with wavelengths in the red region of light and a chromogenic material that gives rise to cyan, the color complementary to red (called C capsules below) are the three kinds of pressure-rupturable capsules prepared. Then, these three kinds of pressure-rupturable capsules are distributed evenly over the top of the light-permeable substrate in the shape of a sheet to give a coated photosensitive sheet. This photosensitive sheet, when it is exposed to light reflected from a manuscript that is illuminated with white light, has the photosensitive material in each of the pressure-rupturable capsules of the said photosensitive sheet harden in response to the amount of light of the various wavelengths of the light for exposure, resulting in the formation on the photosensitive sheet of a latent image that has color information. Then, the photosensitive sheet that has this kind of a latent image is put together with pressure with an image-receiving sheet coated with developing materials that give rise to specific colors when they react with the chromogenic materials in the different pressure-rupturable capsules. In this way, the pressure-rupturable capsules on the said photosensitive sheet that have photosensitive material that is still not hardened are ruptured, and the chromogenic material in the inside flows out, reacting with the developing materials of the image-receiving material, giving rise to a specific color. The result is that a color image is formed on the image-receiving sheet that corresponds to the color image of the manuscript.

In this way, in the method for the formation of color images by use of a photosensitive sheet coated evenly with three kinds of pressure-rupturable capsules on top of a light-permeable substrate, it is not necessary to decompose the color images of the manuscript into the wavelengths of the light (blue, green, and red) to which the photosensitive materials of the different pressure-rupturable capsules are sensitive. Therefore, this method for the formation of images can be used to form a latent image that corresponds to the color image of the manuscript on the photosensitive sheet with exposure to light that is merely white light reflected from the manuscript.

So that wrinkling does not occur at the time of exposure to light, and so that the image of the manuscript is formed at a particular position on the photosensitive sheet, the photosensitive sheet is exposed to the image of the manuscript when placed on a sheet-exposure stand. This sheet-exposure stand is conventionally in the shape of a drum, a belt, a plate, or such various kinds of shapes, but with the use of any of these shapes, the light absorbance ratio is high on the surface on which the sheet is placed. In this way, with a sheet-exposure stand that has a high light-absorbance ratio on the surface on which the sheet is placed, light that does not directly contribute to the exposure of the photosensitive sheet placed on the surface on which the sheet is placed (light that is reflected from the sheet-exposure stand directly) is absorbed by the surface of said sheet-exposure stand on which the sheet is placed, which prevents the exposure of the photosensitive sheet with this kind of light.

However, ordinarily, the amount of light that directly illuminates the sheet-exposure stand without directly exposing the photosensitive sheet is very small. The photosensitive material contained in the pressure-rupturable capsules of the photosensitive sheet is relatively insensitive to light, and for that reason, by simple exposure of the photosensitive sheet to the image of the manuscript, there is a possibility that the specific photosensitive material will not harden. Moreover, if the amount of light used for exposure is small, there is a possibility that the time taken for hardening of the photosensitive material will be long. In order to decrease these possibilities, the increasing of the amount of light used to expose the photosensitive sheet has been tried. However, to do this, it is necessary to increase the scale of the light source, to lengthen the time of exposure, and so on. Also, if the amount of light used for exposure of the photosensitive sheet is increased, photosensitive material that should not be hardened may become hardened.

The photosensitive materials that are contained in the pressure-rupturable capsules that coat the photosensitive sheet have individual light-sensitivities depending on their variety. For this reason, it is extremely difficult to have equal sensitivity to the different wavelengths of light when the three kinds of photosensitive materials are hardened by three different wavelengths of light. Therefore, the pressure-rupturable capsules that contain photosensitive materials with poor light-sensitivity are hardened with difficulty, and when these pressure-rupturable capsules are ruptured when the photosensitive sheet and the image-receiving sheet are placed together with pressure, there is the danger that the chromogenic material on their insides will give rise to color. In this case, it will not be possible to reproduce the color image of the manuscript faithfully.

In order to solve these kinds of problems, a method for the exposure of photosensitive sheets has been proposed in which white light is used to illuminate the manuscript, and the amount of light that reflects from the said manuscript is calibrated by filters. As shown in FIG. 14, the photosensitive sheet 10 that is used in this method is constituted of a light-permeable substrate 11 made of polyester film or the like and three kinds of pressure-rupturable capsules 12 that give rise to three different colors. The pressure-rupturable capsules 12 include C capsules that contain a chromogenic material that gives rise to the color cyan at the time of development, M capsules that contain a chromogenic material that gives rise to the color magenta at the time of development, and Y capsules that contain a chromogenic material that gives rise to the color yellow at the time of development. The different kinds of capsules are evenly distributed so as to coat the top of the substrate 11. This photosensitive sheet 10 is placed on the top of a sheet-exposure stand, and a manuscript 6 is illuminated with white light, so that the light that is reflected from the said manuscript 6 passes through a filter 3, exposing the sheet and selectively hardening the different pressure-rupturable capsules 12 (the pressure-rupturable capsules that are hatched in the figure are hardened). This forms a latent image with color information on the photosensitive sheet 10. The filter 3 functions to calibrate the sensitivity of the three kinds of pressure-rupturable capsules. Each kind of pressure-rupturable capsule has its own sensitivity characteristics, as shown, for example, in FIG. 15, wherein the sensitivity of the C capsules is greater than the sensitivities of the Y capsules and the M capsules. Therefore, even if the amount of red light to which the C capsules are sensitive is small, the said C capsules will harden. For that reason, in order to make the sensitivity of the three kinds of pressure-rupturable capsules the same, a filter that absorbs the red light to which the C capsules are sensitive is used, and the amount of said red light is decreased, which is the same in effect as increasing the amount of light in the wavelengths to which the Y capsules and the M capsules are sensitive. In this way, the apparent shift of the characteristic curve of the C capsules shown in FIG. 15 to the right can be attained. By this principle, if proper absorbance characteristics of red light by the filter 3 are selected, then, as shown in FIG. 16, it is possible to make the sensitivity characteristics of each of the kinds of pressure-rupturable capsules apparently approximately equal.

However, in this method for the formation of an image in which the sensitivity of the pressure-rupturable capsules are calibrated by the use of the above-mentioned filter, because light is absorbed by the filter, the overall amount of light that is used for the exposure to light of the photosensitive sheet is decreased. For this reason, it is necessary to increase the overall amount of white light used to illuminate the manuscript, and thus, it is necessary both to increase the size of the light source and to lengthen the time of exposure.

SUMMARY OF THE INVENTION

The sheet-exposure stand of this invention, which overcomes the above-discussed and numerous other disadvantages and deficiencies of the prior art, supports a photosensitive sheet on its sheet-placement surface, said photosensitive sheet being composed of a light-permeable substrate that is coated with pressure-rupturable capsules that contain chromogenic materials and photosensitive materials that are hardened when illuminated with light, and said sheet-placement surface being coated with or made of a light-reflective substance. The sheet-placement surface of the stand has spectral reflectivity properties that correspond to the wavelengths of light to which any one of the photosensitive materials is photosensitive.

In a preferred embodiment, the sheet-exposure stand has a single or plural sheet-placement surfaces that have different kinds of spectral reflectivity properties.

In a preferred embodiment, the sheet-exposure stand has sheet-placement surfaces that can be changed selectively, so that the sheet-placement surface selected has the desired spectral reflectivity properties.

In a preferred embodiment, the pressure-rupturable capsules contain photosensitive materials that are photosensitive to different wavelengths of light.

In a preferred embodiment, each of said chromogenic materials contained in said pressure-rupturable capsules gives rise to a color that is a complementary color to the color of the light of the wavelength to which said photosensitive materials contained in said pressure-rupturable capsules are photosensitive.

The method for the formation of images of this invention comprises placing a photosensitive sheet on the sheet-placement surface of a light-reflective stand that is light-reflective, said photosensitive sheet being composed of a light-permeable substrate that is coated with pressure-rupturable capsules that contain chromogenic materials and photosensitive materials that are hardened when illuminated with light; exposing said photosensitive sheet to light from or through a given image of the manuscript; placing said photosensitive sheet on an image-receiving sheet that is coated with developing materials so that said pressure-rupturable capsules of said photosensitive sheet can be brought into contact with said developing materials of said image-receiving sheet; and applying pressure to said two sheets.

In a preferred embodiment, the pressure-rupturable capsules contain photosensitive materials that are photosensitive to different wavelengths of light.

In a preferred embodiment, each of said chromogenic materials contained in said pressure-rupturable capsules gives rise to a color that is a complementary color to the color of the light of the wavelength to which said photosensitive materials contained in said pressure-rupturable capsules are photosensitive.

In a preferred embodiment, the sheet-placement surface of the stand has spectral reflectivity properties that correspond to the wavelengths of light to which any one of the photosensitive materials is photosensitive.

The apparatus for the formation of images of this invention comprises a sheet-exposure stand on which a photosensitive sheet is placed, said photosensitive sheet being composed of a light-permeable substrate that is coated with pressure-rupturable capsules that contain a chromogenic material and photosensitive materials that are hardened when illuminated with light, wherein the sheet-placement surface of said sheet-exposure stand on which said photosensitive sheet is placed has light-reflecting properties.

In a preferred embodiment, the pressure-rupturable capsules contain photosensitive materials that are photosensitive to different wavelengths of light.

In a preferred embodiment, each of said chromogenic materials contained in said pressure-rupturable capsules gives rise to a color that is a complementary color to the color of the light of the wavelengths to which said photosensitive materials contained in said pressure-rupturable capsules are photosensitive.

In a preferred embodiment, the sheet-placement surface of the stand has spectral reflectivity properties that correspond to the wavelengths of light to which any one of the photosensitive materials is photosensitive.

In a preferred embodiment, the sheet-exposure stand has a single or plural sheet-placement surfaces that have different kinds of spectral reflectivity properties.

In a preferred embodiment, the sheet-exposure stand has sheet-placement surfaces that can be changed selectively, so that the sheet-placement surface selected has the desired spectral reflectivity properties.

Thus, the invention described herein makes possible the objectives of (1) providing a method for the formation of images by which pressure-rupturable capsules of a photosensitive sheet are exposed to light reflected from the surface of a sheet-placement stand, in which there is no need to increase the size of the light source or to lengthen the exposure time; (2) providing a method for the formation of images in which because there is no need for the use of a filter, a decrease in the amount of light needed for exposure can be prevented, resulting in a distinct color image with reproducibility; and (3) providing an apparatus by which the above-mentioned method can be carried out.

BRIEF DESCRIPTION OF THE DRAWINGS

This invention may be better understood and its numerous objects and advantages will become apparent to those skilled in the art by reference to the accompanying drawings as follows:

FIG. 10 is a perspective view showing the main portion of the sheet-exposure stand of the apparatus shown in FIG. 9.

FIG. 11 is a graph showing the spectral reflectivity characteristics of the sheet-exposure stand shown in FIG. 10.

FIG. 12A is a schematic diagram showing another apparatus of this invention.

DESCRIPTION OF THE PREFERRED EMBODIMENTS

EXAMPLE 1

Figure 1:
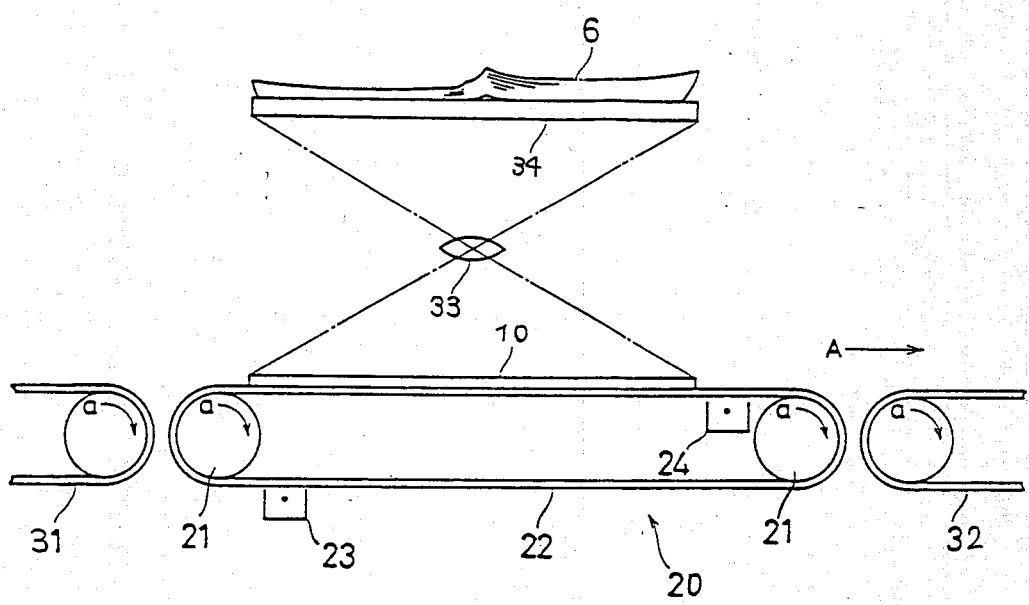
FIG. 1 is a schematic diagram showing an apparatus of this invention.

FIG. 1 shows an apparatus of this invention, in which a sheet-exposure stand 20 on which a photosensitive sheet 10 is placed comprises a pair of rotatable rollers 21 and a belt 22 that engages with the rollers 21. The belt 22, by being rotated by the rollers 21 in the direction shown by arrow A in FIG. 1, conveys the photosensitive sheet 10 in the direction of arrow A of FIG. 1. The sheet-exposure stand 20 is positioned between the supplying belt 31 and the ejecting belt 32. The supplying belt 31 supplies the photosensitive sheet 10 to the top of the sheet-exposure stand 20, and the ejecting belt 32 ejects the photosensitive sheet 10 from the sheet-exposure stand 20 and conveys it to a given place where it will be placed together with an image-receiving sheet, to both of which pressure will be applied.

The sheet-placement belt 22 of the sheet-exposure stand 20 is made of, for example, a sheet of polystyrene that contains white pigment. The polystyrene sheet is reflective of white light over its entire surface, and also has insulating properties.

Underneath the sheet-placement belt 22 in the vicinity of the supplying belt 31, there is an electrical charger 23 that charges the sheet-placement belt 22 just before the photosensitive sheet 10 is placed thereon. Underneath the portion of the sheet-placement belt 22 on which the photosensitive sheet 10 is placed in the vicinity of the ejecting belt 32, there is a decharger 24 that decharges the sheet-placement belt 22 immediately before the photosensitive sheet 10 is conveyed to the ejecting belt 32.

The photosensitive sheet 10 is conveyed to the sheet-placement belt 22 that has been charged by the charger 23 from the supplying belt 31, and is held by static electricity on the sheet-placement belt 22. Then, the sheet-placement belt 22 is discharged by the discharger 24 while the photosensitive sheet 10 is placed thereon, and the photosensitive sheet 10 is peeled from the sheet-placement belt 22 and conveyed to the ejecting belt 32.

A manuscript stand 34 made of transparent glass or the like is disposed so as to face the portion of the sheet-placement belt 22 on which the photosensitive sheet 10 is placed. On the manuscript stand 34, a manuscript 6 to be copied is placed. The manuscript 6 is illuminated with white light from a light source (not shown). The light reflected from the manuscript 6 passes through a lens 33 to illuminate the photosensitive sheet 10 that is on the sheet-placement belt 22.

Figure 2:
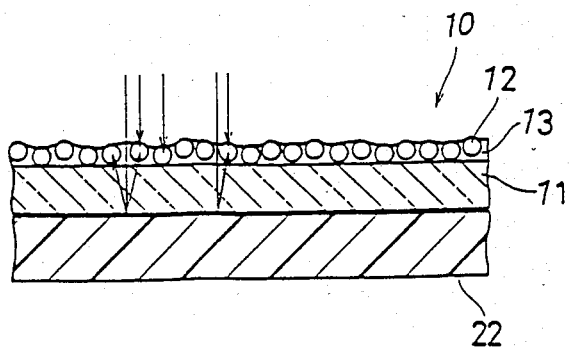
FIG. 2 is a diagram showing the exposure of a photosensitive sheet by the apparatus shown in FIG. 1.

The photosensitive sheet 10 is composed of, as shown in FIG. 2, a sheet-shaped substrate 11 that is permeable to light and pressure-rupturable capsules 12 that coat the substrate 11 by means of a binder 13. The substrate is made of, for example, polyethylene terephthalate (PET) and has a thickness of about twelve micrometers to several dozens of micrometers. In the pressure-rupturable capsules 12, there are photosensitive materials (e.g., compounds having two or more ethylenically unsaturated terminal groups) that harden when illuminated by light, and chromogenic materials (e.g., colorless compounds having in its partial skeleton a lactone, a lactam, a sultone, a spiropyran, an ester, or an amino structure) that give rise to a specific color. The diameter of each of the capsules is about 5-6 $\mu m$. This kind of photosensitive sheet 10 can be precut to a fixed length or can be in the shape of a roll.

When the photosensitive sheet 10 is illuminated with light that has reflected from a manuscript, some of the light is directly absorbed by certain pressure-rupturable capsules 12, hardening the photosensitive materials contained in their insides, as shown in FIG. 2 by the arrows. The remaining light passes through the capsules 12, the binder 13, and the substrate 11, and reaches the surface of the sheet-placement belt 22 by which the light undergoes diffused reflection or mirror-wise reflection and returns to the capsules 12, by which the light is absorbed, hardening the photosensitive materials contained in the capsules 12. In this way, the photosensitive materials that must be hardened by light are hardened both by light reflected from the manuscript 6 and by light reflected from the sheet-placement belt 22, so the photosensitive materials are hardened without fail. Moreover, even when the light that is reflected from the manuscript 6 passes through the substrate 11 of the photosensitive sheet 10, and undergoes diffused reflection by the surface of the sheet-placement belt 22 on which the photosensitive sheet 10 is placed, pressure-rupturable capsules that need not be light-hardened will not be hardened, because the said substrate 11 is thin and the amount of light that permeates through the substrate 11 is slight.

In this way, a latent image is formed on the photosensitive sheet 10 that corresponds to the image of the manuscript 6. Then, photosensitive sheet 10 on which this latent image has been formed is conveyed by the ejection belt 32 to a specified position at which the photosensitive sheet 10 is placed together with an image-receiving sheet and pressure is applied thereto. The image-receiving sheet is composed of a substrate in the shape of a sheet that is coated with developing materials. The developing materials are those conventionally employed in carbonless paper technology and are well known, examples of which are clay minerals such as acid clay, active clay; organic acid such as tannic acid; acid polymers such as phenol-formaldehyde resins, etc. The developing materials of the said image-receiving sheet and the pressure-rupturable capsules 12 of the photosensitive sheet 10 are placed together so as to come into contact with each other, and pressed together. Accordingly, the non-hardened pressure-rupturable capsules 12 of the photosensitive sheet 10 rupture, and the chromogenic material contained inside of these pressure-rupturable capsules flows out. The said chromogenic material reacts with the developing materials of the image-receiving sheet, giving rise to color, and forming a particular image on the image-receiving sheet. In this way, the latent image that is formed on the photosensitive sheet 10 is developed, becoming visible, when brought together with the image-receiving sheet, and the image is transcribed onto the image-receiving sheet. The substrate of the image-receiving sheet need not be permeable to light; paper, resin, or the like can be used.

EXAMPLE 2

Figure 3:
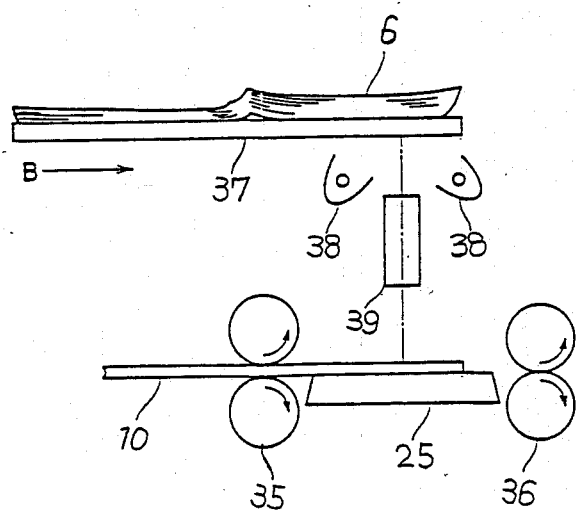
FIG. 3 is a schematic diagram showing another apparatus of this invention.

FIG. 3 shows another apparatus of this invention, in which a sheet-exposure stand 25 is formed from a metal plate, a resin plate, a colored resin plate that is white, or other kind of fixed plate that can reflect light; that is, the sheet-placement surface of the sheet-exposure stand 25 has light-reflecting properties. The sheet-exposure stand 25 is between the supplying roller 35 and the ejecting roller 36. The supplying roller 35 conveys the photosensitive sheet 10 onto the sheet-exposure stand 25, and the ejecting roller 36 removes the photosensitive sheet 10 from the sheet-exposure stand 25, conveying it to a position at which it can be placed together with an image-receiving sheet. While the supplying roller 35 and the ejecting roller 36 are conveying the photosensitive sheet 10, they press the said photosensitive sheet 10 with only slight pressure, so as not to rupture the pressure-rupturable capsules 12; for this purpose, the rollers are made of rubber or the like.

The sheet-exposure stand 25 is placed so as to face a manuscript stand 37 that is made of transparent glass or the like. The manuscript stand 37 is such that it can be moved in the direction shown by arrow B in FIG. 3 and also in the opposite direction. Under the manuscript stand 37, there is a pair of light sources 38 attached in fixed positions. White light from the light sources 38 illuminates the manuscript that is placed on the top of the manuscript stand 37, which can move in the direction of arrow B. A light-collimation transmitter 39 is disposed in the space between the light sources 38. The white light that is projected on the manuscript 6 is reflected from the manuscript 6 and then projected in the direction of the sheet-exposure stand 25 by the light-collimating transmitter 39. When the manuscript stand 37 is moved in the direction of arrow B, the photosensitive sheet 10 is conveyed in the same direction at the same speed as the manuscript, and is placed on the sheet-exposure stand 25. Then, the photosensitive sheet 10 that has been moved at the same speed as the manuscript onto said sheet-exposure stand 25 is exposed by reflected light from the manuscript. Then, in the same way as in Example 1, the photosensitive material contained in the pressure-rupturable capsules is exposed directly to light from the manuscript, and is also exposed to light that is reflected from the sheet-placement surface of the sheet-exposure stand 25, resulting in a hardening of the photosensitive materials. Thereafter, the photosensitive sheet is placed together with the image-receiving sheet and the two are pressed together;

in the same way as in Example 1, a particular image is formed on the image-receiving sheet.

In this example, because the photosensitive sheet 10 is sandwiched between the supplying rollers 35 and conveyed to the sheet-exposure stand 25 and it is also sandwiched between the ejecting rollers 36 and conveyed from said sheet-exposure stand 25 to a specific position, the sheet-exposure stand 25 need not hold the photosensitive sheet 10 by static electricity; therefore, the sheet-exposure stand 25 need not be insulated.

Figure 4:
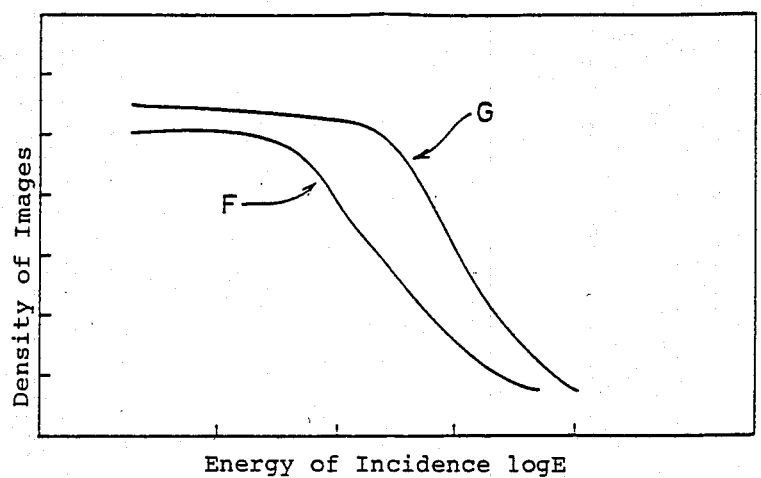
FIG. 4 is a graph showing the relationship between the image density and the amount of light for exposure of images formed by the apparatuses of FIGS. 1 and 3.

FIG. 4 compares the density of the images with the use of the sheet-exposure stand of this example, F, and the use of a conventional light-receiving sheet, G, when the length of the time of illumination is the same, wherein the abscissa indicates the relative value of the energy of incidence and the ordinate indicates the density of the image. It can be seen from FIG. 4 that when the sheet-exposure stand of this example is used, the pressure-rupturable capsules of the specific areas that have been exposed to light are hardened without fail, which makes it possible to reproduce the image with faithfulness, whereas when the conventional light-receiving sheet is used, the density of the image becomes high, which makes it impossible to reproduce the image of the manuscript faithfully.

If the entire portion, including the sheet-exposure stand, to be exposed to light is enclosed in a dark box with excellent absorbance of light, it is possible to prevent completely the exposure of the photosensitive sheet by reflected light that did not directly illuminate the photosensitive sheet.

EXAMPLE 3

Figure 5:
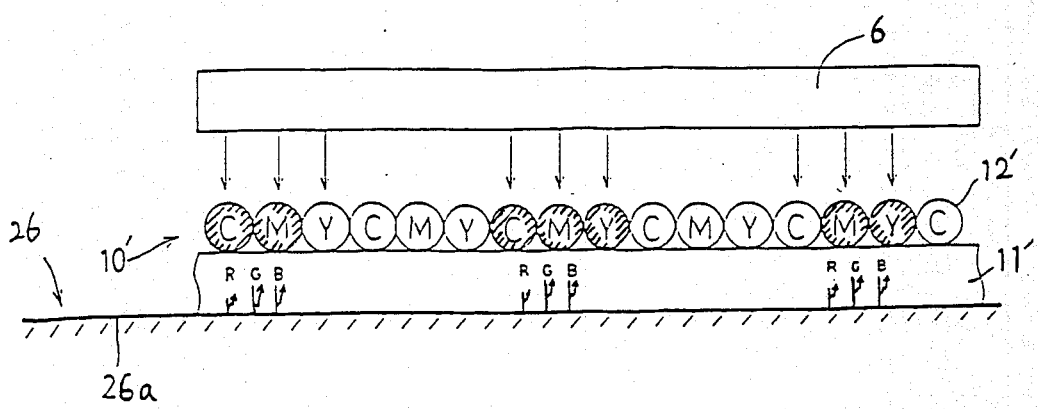
FIG. 5 is a diagram showing the exposure of another photosensitive sheet of this invention.

This example discloses the formation of colored images by the use of another photosensitive sheet. As shown in FIG. 5, a photosensitive sheet 10' is composed of a colorless, transparent substrate 11' that is made of, for example, polyethylene terephthalate (PET) in sheet form, and three kinds of pressure-rupturable capsules 12' that are uniformly dispersed on the substrate 11'. The substrate 11' has a thickness of about twelve micrometers to several dozens of micrometers. The pressure-rupturable capsules 12' that coat the said substrate 11' include pressure-rupturable capsules Y that contain photosensitive materials that are hardened by light in the blue wavelength and a chromogenic material (a colorless pigment) that gives rise to yellow, which is the complementary color to blue; pressure-rupturable capsules M that contain photosensitive materials that are hardened by light in the green wavelength and a chromogenic material (a colorless pigment) that gives rise to magenta, which is the complementary color to green; and pressure-rupturable capsules C that contain photosensitive materials that are hardened by light in the red wavelength and a chromogenic material (a colorless pigment) that gives rise to cyan, which is the complementary color to red. The diameter of the individual pressure-rupturable capsules is 5–6 μm.

When this kind of photosensitive sheet is used to form a colored image, the sheet-placement surface of the sheet-exposure stand 26 on which the photosensitive sheet 10' is placed has spectral reflective properties. The sheet-exposure stand 26 is made of a metal stand that is painted with resin 26a that has spectral reflective properties that cause it to reflect all light except for red light, 90% of which is absorbed by the resin 26a. When the photosensitive sheet 10' is placed on the sheet-exposure stand 26 and white light is used to illuminate manuscript 6, the light reflected from the manuscript 6 illuminates the photosensitive sheet 10', and most of the light that has been reflected from the manuscript 6 to illuminate the photosensitive sheet 10' is absorbed by the pressure-rupturable capsules 12' of the photosensitive sheet 10', but some of the light passes through the light-permeable substrate 11' of the photosensitive sheet 10', to be reflected from the sheet-exposure stand 26, passing again through the substrate 11' to reach the pressure-rupturable capsules 12'. At this time, the sheet-exposure stand 26 absorbs 90% of the red light of the total light that is incident upon the said stand 26, and reflects all of the rest of the light. Accordingly, as shown in FIG. 5, the green light (G) and the blue light (B) that reaches the sheet-placement surface of the sheet-exposure stand 26 is not absorbed by the sheet-placement surface of said sheet-exposure stand 26, but all of this light reaches the pressure-rupturable capsules 12', and is absorbed by the Y capsules and the M capsules, respectively. In contrast, the red light (R) that reaches the sheet-placement surface of the sheet-exposure stand 26 is almost all absorbed by the resin 26a of the sheet-placement surface, and only some of the red light (R) is reflected by the sheet-placement surface, to reach the pressure-rupturable capsules 12', and to be absorbed by the C capsules.

Figure 6:
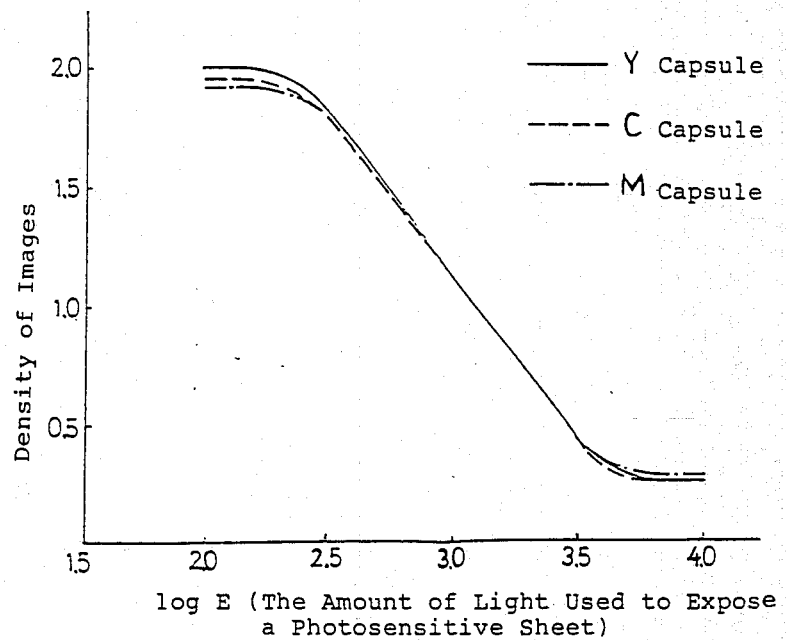
FIG. 6 is a graph showing the apparent photosensitivity characteristics of the pressure-rupturable capsules of the photosensitive sheet shown in FIG. 5.
Figure 7:
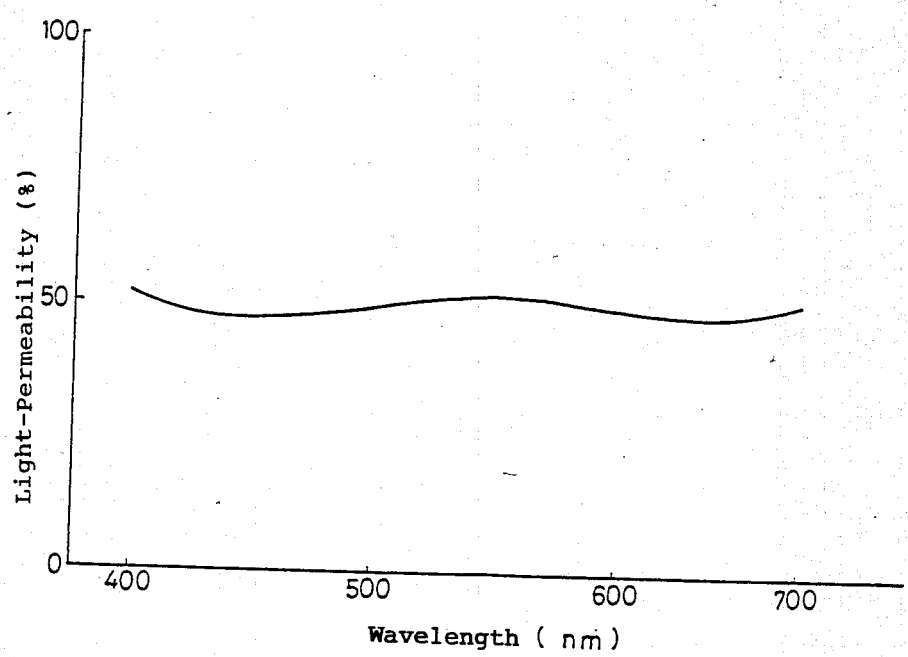
FIG. 7 is a graph showing the light-permeability characteristics of the substrate of the photosensitive sheet of FIG. 5.
Figure 15:
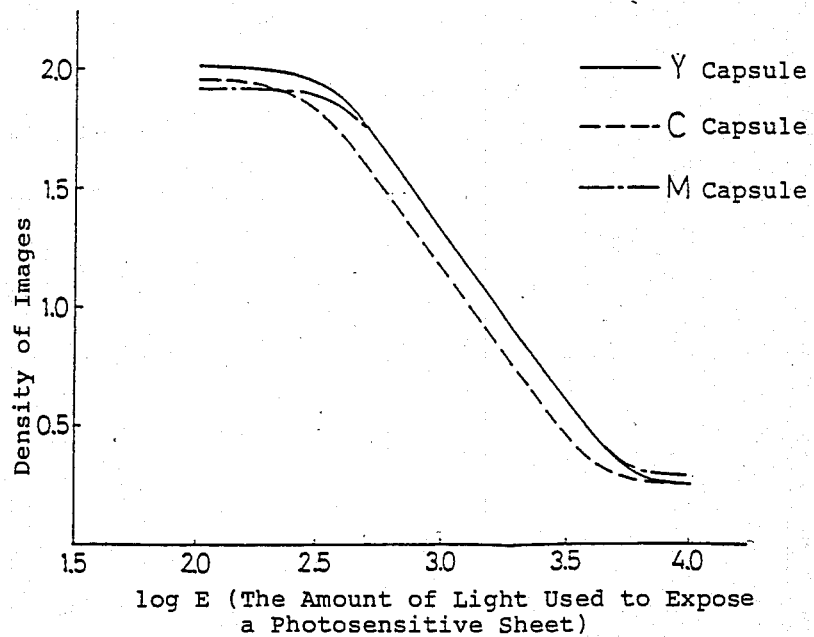
FIG. 15 is a graph showing the sensitivity of the pressure-rupturable capsules used in the conventional method for the formation of images.
Figure 16:
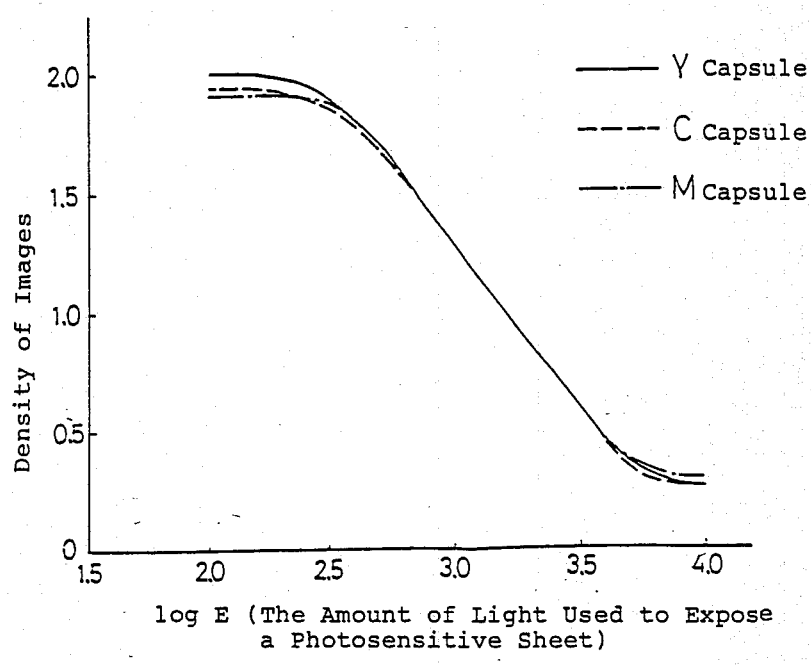
FIG. 16 is a graph showing the apparent sensitivity characteristics of the pressure-rupturable capsules used in the conventional method for the formation of images.

The pressure-rupturable capsules 12' of the photosensitive sheet 10' have the sensitivity properties shown in FIG. 15, and when an image is formed by the use of a photosensitive sheet 10' coated with pressure-rupturable capsules 12' with these kinds of sensitivity characteristics, as shown in FIG. 6, the apparent sensitivity of the pressure-rupturable capsules 12' can be made to be almost the same as the apparent sensitivity of the pressure-rupturable capsules 12' when the photosensitive sheet is exposed to light with use of a conventional filter (see FIG. 16). Besides, in this case, compared to the situation in which a filter is used, the light that reaches the photosensitive sheet 10' is almost 1.3 times as great. The spectral permeation characteristics of the light-permeable substrate 11' of the photosensitive sheet 10' at this time are shown in FIG. 7. In this example, the sheet-exposure stand 26 is made with spectral reflective properties such that 90% of red light is absorbed; this property changes with changes in the spectral permeation characteristics of the light-permeable substrate 11' of the photosensitive sheet 10' (see FIG. 7) and the like, so it is preferable to find the optimum value by experiment.

Figure 8:
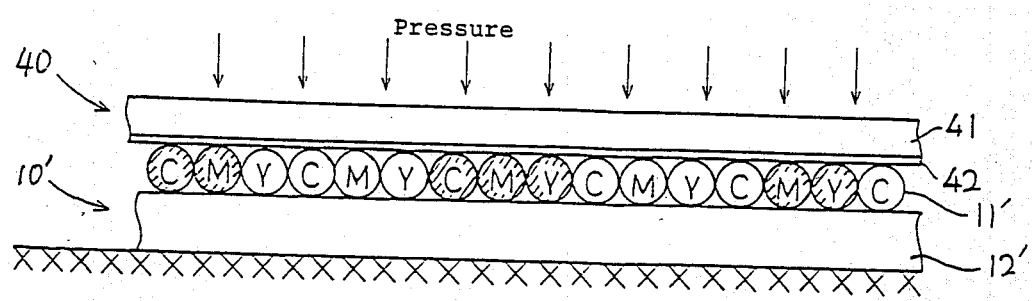
FIG. 8 is a diagram showing the process by which a latent image on the photosensitive sheet of FIG. 5 becomes visible.

In this way, the photosensitive sheet 10' that has a latent image thereon with specific color information is brought together with an image-receiving sheet 40, as shown in FIG. 8, and the two are pressed together. The image-receiving sheet 40 is made of a substrate 41 in the form of a sheet that is coated with developing materials 42 that give rise to color when brought into contact with the chromogenic material of the pressure-rupturable capsules. The image-receiving sheet 40 is disposed on the photosensitive sheet 10' in such a way that the developing materials 42 of the image-receiving sheet 40 and the pressure-rupturable capsules 12' of the photosensitive sheet 10' are brought into contact, and then pressure is applied to the two, rupturing the pressure-rupturable capsules 12' that have not hardened, causing the chromogenic materials inside to flow out. This chromogenic material reacts with the developing materials 42, and each chromogenic material gives rise to a specific color, so that a colored image is formed on the image-receiving sheet 40 that corresponds to the colored image of the manuscript.

As described above, in this example, it is possible to calibrate the light-sensitivity of the pressure-rupturable capsules without the use of a filter, and compared to when a filter is used to adjust the amount of light used to expose the photosensitive sheet 10', there is 1.3 times as much light, so there is no need to increase the size of the light source, or to increase the intensity of the light source by increasing the amount of electricity supplied. Moreover, when slit exposure is used, it is not necessary to increase the length of the exposure. The light that has once passed through the photosensitive sheet is once more reflected by the sheet-placement surface of the sheet-exposure stand, and can once more be used for exposure, so there is the merit of the efficient use of the light.

In this example, a metal stand painted with a resin is used as the sheet-placement stand, but because the sheet-exposure stand reflects light so that the reflected light can be used again, there is a possibility that the reflected light cannot be used with efficiency if the photosensitive sheet and the sheet-exposure stand are not attached firmly to each other. In order to prevent this possibility, a sheet-exposure stand is constituted by the sheet-placement belt that engages with a pair of rotating rollers such as that of Example 1, so that the photosensitive sheet will be held by static electricity on the sheet-placement belt.

EXAMPLE 4

Figure 9:
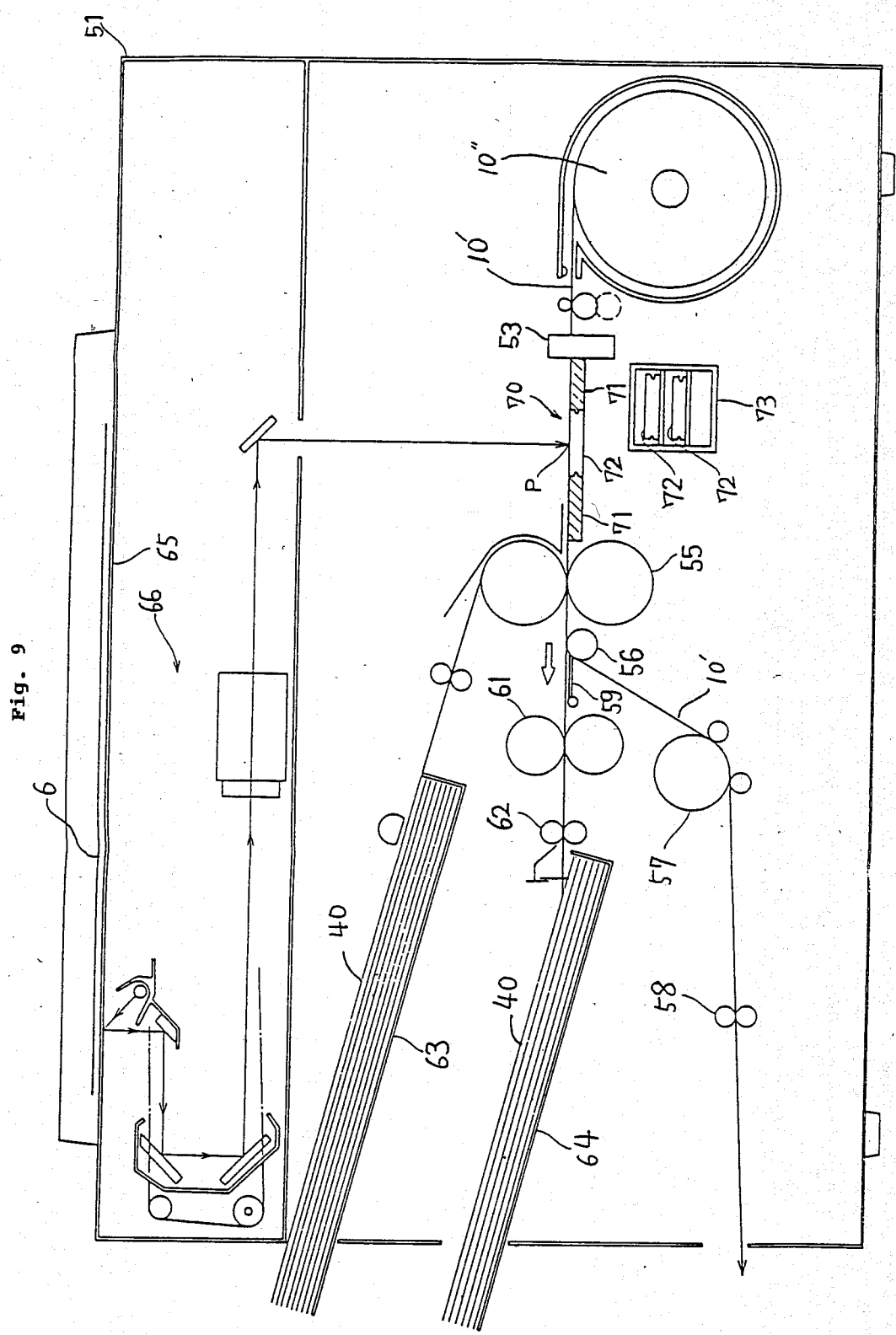
FIG. 9 is a schematic diagram showing another apparatus of this invention.

FIG. 9 shows another apparatus that is used in the method for the formation of images of this invention. This apparatus has a photosensitive sheet roller 10" on one side of the lower portion of the apparatus body 51. The photosensitive sheet roller 10" is a roller around which is rolled a photosensitive sheet 10' above. The photosensitive sheet 10' is composed of, as shown in FIG. 5, a light-permeable substrate 11' that is uniformly coated with three kinds of pressure-rupturable capsules 12': Y capsules, M capsules, and C capsules. The photosensitive sheet roller 10" can be put into and removed from the apparatus body 51. As the photosensitive sheet 10' is released by the photosensitive sheet roller 10", it is supplied to the top of the sheet-exposure stand 70 after passing through the region where there is a cutter 53. Then, after the photosensitive sheet 10' is exposed to light through a specific image, the sheet is conveyed from the sheet-exposure stand 70 to the outside of the apparatus body 51 through a pressure roller 55 by paper-ejection rollers 56, 57, and 58.

The manuscript 6 to be copied is placed in a manuscript stand 65 that is provided on the upper surface of the apparatus body 51. Under the manuscript stand 65, there is an optical system 66 that has a light source, mirror lenses, and the like. The optical system 66 sends white light to the manuscript 6 placed on the manuscript stand 65 so as to scan across the manuscript 6. The light reflected from manuscript 6 illuminates the exposure-point P on the top of the sheet-exposure stand 70.

On the side opposite to the side in which the photosensitive sheet roller 10" is provided in the apparatus body 51, there is a paper-supply cassette 63 that is provided with an image-receiving sheet 40. The image-receiving sheet 40, as shown in FIG. 8, is composed of a sheet-shaped substrate 41 that is coated with a developing material 42. The image-receiving sheet 40 that is supplied within the paper-supply cassette 63 is conveyed to pressure rollers 55 by which the direction of its conveyance is reversed. At this time, the image-receiving sheet 40 is brought together with the photosensitive sheet 10' that is dispensed by the photosensitive sheet roller 10", and both are pressed together by pressure rollers 55. The image-receiving sheet 40 and the photosensitive sheet 10' are conveyed together to the paper-ejection roller 56 in the downstream direction of flow of the pressure rollers 55, in which the image-receiving sheet 40 is separated from the photosensitive sheet 10' by a separation hook 59. Then, the image-receiving sheet 40, after it is heated by heated rollers 61, is conveyed to the paper-ejection tray 64 that is provided below the paper-supply cassette 63. A part of said paper-ejection tray 64 projects from the apparatus body 51.

The photosensitive sheet 10' that is dispensed from the photosensitive sheet roller 10" is placed on the sheet-exposure stand 70. The sheet-exposure stand 70 comprises, as shown in FIG. 10, a pair of guide plates 71 that are approximately horizontally disposed with an appropriate distance therebetween in the direction of the conveyance of the photosensitive sheet 10', and a spectral-reflectance plate 72 that engages with the two guide plates 71. The top surface of the spectral-reflectance plate 72 that is fitted together with the two guide plates 71 is used as the sheet-placement surface, the center of which is exposure-point P. So that the top surface of the guide plates 71 will absorb light, it is black. On the sides of the two guide plates 71 that face each other, there are projections 71a, and on both sides of the spectral-reflectance plate 72 that face these sides in the guide plates 71 that have projections 71a, there is a groove 72a that fits together with the projections 71a. Therefore, as shown in FIG. 10, the spectral-reflectance plate 72 can move with respect to the two guide plates 71 in the direction of arrow C. On one surface of the direction in which the spectral-reflectance plate 72 slides, there is a handle 72b, and the spectral-reflectance plate 72 is made to slide by the handle 72b being grasped, so that the spectral-reflectance plate 72 can be removed from or replaced between the guide plates 71. It is possible for the spectral-reflectance plate 72 to be replaced by insertion between the two guide plates 71 with its upper surface downward. Thus, the spectral-reflectance plate 72 has two sheet-placement surfaces.

The spectral-reflectance plate 72 is made of, for example, a metal plate or the like, and is coated on each side on the sheet-placement surfaces with spectral-reflectance materials that have different spectral-reflectance properties. In this example, three spectral-reflectance plates 72 are prepared, and each is coated on both sheet-placement surfaces with a total of six different materials with spectral reflectance properties, all of which are different. The spectral-reflectance materials 1 to 6 that are used in this example have, for example, the spectral reflectance properties shown in FIG. 11; spectral-reflectance material 1 reflects 80–90% of all white light, spectral-reflectance material 2 reflects 80% of light in the blue wavelength and 20% of light in the yellow wavelength, spectral-reflectance material 3 reflects 80% of light in the cyan wavelength and 20% of light in the red wavelength, and so on. The three spectral-reflectance plates 72 that are coated on their sheet-placement surfaces with materials having different spectral reflectance can be selected for the most suitable spectral-reflectance properties based on the characteristics of sensitivity to light of the photosensitive sheet 10' in terms of the coatings of the sheet-placement surfaces of the spectral-reflectance plates 72. Under the sheet-exposure stand 70, there is a storage box 73 for the various spectral-reflectance plates 72. At the base of the handles 72b of each spectral-reflectance plate 72, there is a tag 72d that states the spectral-reflectance properties of the spectral-reflectance materials that are used to coat each surface of the sheet-placement surfaces. On each of these tags 72d, there are shown the spectral-reflectance properties of that sheet-placement surface; for example, a surface that reflects blue light is labelled "B", a surface that reflects cyan is labelled "C", and the like.

The color information that is formed as a latent image on the photosensitive sheet 10' has its colors changed according to the characteristics of sensitivity to light of the three kinds of pressure-rupturable capsules that the photosensitive sheet 10' is coated with. For example, of the three kinds of pressure-rupturable capsules 12', (i) with a photosensitive sheet 10' with Y capsules that have poor sensitivity to light, the image that is formed will tend to be yellowish, and (ii), when a photosensitive sheet 10' with Y capsules and M capsules that have poor sensitivity to light, the image that is formed will tend to be reddish. For that reason, for a sheet-placement surface of the spectral-reflectance plate 72, spectral-reflectance properties that reflect much of the wavelengths of light to which the pressure-rupturable capsules have poor sensitivity to can be used; that is, a surface can be chosen that has been coated with spectral-reflectance materials that have spectral-reflectance properties that reflect light of the color that is complementary to the color that will appear strongly on the image, and the photosensitive sheet 10' is placed on the sheet-placement surface that is coated with these spectral-reflectance materials, by the insertion of the spectral-reflectance plate 72 into the space between the guide plates 71. For example, in the case of (i) above, the image that is formed will tend to be yellowish, so the spectral-reflective plate 72 with a sheet-placement surface coated with spectral-reflective material 1 (see FIG. 11) that reflects blue, the color complementary to yellow, should be used (tag 72d labelled "B"). In the case of (ii) above, the image that is formed will tend to be reddish, so the spectral-reflective plate 72 with a sheet-placement surface coated with spectral-reflective material 5 (see FIG. 11) that reflects cyan (a mixture of the colors blue and green), the color complementary to red, should be used (tag 72d labelled "C").

The spectral-reflective material labelled 1 in FIG. 11 that reflects 80% of all white light can be used when a monochrome image is to be formed. Also, in the example above, when a colored image is to be reproduced accurately from a colored image on a manuscript, the need to select the spectral-reflective material used has been explained. In such circumstances as when a particular image is to be formed with emphasis on a particular color, a sheet-placement surface coated with a spectral-reflective material that reflects the color complementary to the color that is to be emphasized should be chosen.

The sheet-exposure stand 70 is equipped with a spectral-reflective plate 72 with sheet-placement surfaces coated with specific spectral reflective materials, and the photosensitive sheet 10' is dispensed by the photosensitive sheet roller 10'', the said photosensitive sheet 10' being conveyed to the sheet-placement surface of the spectral-reflective plate 72. Then, the exposure-point P on the sheet-placement surface of the spectral-reflective plate 72 is illuminated with white light reflected from the illuminated manuscript, exposing the photosensitive sheet 10'. The exposure of the photosensitive sheet 10' in these circumstances is as outlined in the example shown in FIG. 6.

By the exposure of the photosensitive sheet 10' to the image of the manuscript, a latent image is formed that has color information that corresponds to the colored image of the manuscript. Then, the photosensitive sheet 10' that has this latent image, is put together with the image-receiving sheet 40 that conveyed from the paper-supply cassette 63, in such a way that its pressure-rupturable capsules are brought into contact with the developing materials of the image-receiving sheet 40; these two sheets are pressed together by the pressure roller 55. In this way, the pressure-rupturable capsules that have not hardened and that coat the photosensitive sheet 10' are ruptured, so that the chromogenic material contained inside flows out. The said chromogenic material reacts with the developing materials 42 on the image-receiving sheet 40, giving rise to color (see FIG. 8).

Thereafter, the image-receiving sheet 40 is separated from the photosensitive sheet 10' by the separation hook 59, and heated by the heated rollers 61. When the image-receiving sheet 40 is heated by the heated rollers 61, the color reaction of the chromogenic materials is accelerated (see Japanese Laid-Open Patent Application No. 61-24495.) If the image-receiving sheet 40 is already painted with a thermoplastic, polymerizable pigment, the colored image that appears is given glossiness (see Japanese Laid-Open Patent Application No. 60-259,490). The photosensitive sheet 10' that is heated by the heated rollers 61 is conveyed by the paper-ejection roller 62 to the paper-ejection tray 64. The photosensitive sheet 10' is cut to an appropriate length by cutter 53, and ejected to the outside of the apparatus body 51 by the ejection rollers 57 and 58.

EXAMPLE 5

Figure 12B:
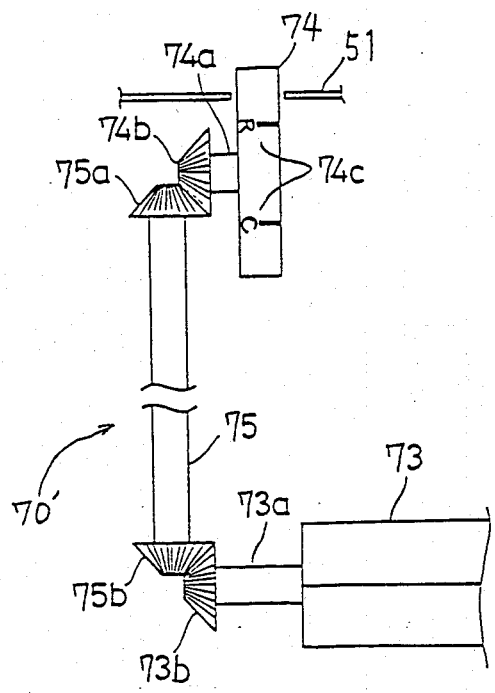
FIG. 12B is a schematic diagram showing the main portion of the apparatus shown in FIG. 12A.

FIG. 12 shows another apparatus of this invention, which is designed so that the different sheet-placement surfaces of the sheet-exposure stand 70' that are coated with various materials with spectral reflective properties can be selected by the rotation of an operation dial. The said copying apparatus is different from the copying apparatus of Example 4 only in the construction of its sheet-exposure stand. The sheet-exposure stand 70' of the copying apparatus has, as in FIG. 12B, a spectral reflectance means 73 in the shape of a six-cornered column. This spectral reflectance means 73 has on its outer surface six sheet-placement surfaces, and each of the sheet-placement surfaces is coated with a different spectral reflectance material 1-6 (see FIG. 11). Provided along the long axis of the spectral reflectance means 73 is a revolving shaft 73a; by the revolution of the revolving shaft 73a, the spectral reflectance means 73 revolves. At one end of the revolving shaft 73a there is attached level gear 73b.

An operation dial 74 for the revolution of the spectral reflectance means 73 is provided at a position near the top surface of the apparatus body 51. The operation dial 74 protrudes partly from the upper surface of the apparatus body 51. The center of said operation dial 74 is provided with a rotating shaft 74a, and the rotating shaft 74a rotates in one piece with the operation dial 74. The rotating shaft 74a has a bevel gear 74b provided at one end. The bevel gear 74b meshes with the bevel gear 75a attached to one end of a transmission shaft 75. At the other end of the transmission shaft 75, a bevel gear 75b is attached, and the bevel gear 75b meshes with the bevel gear 73b attached to the revolving shaft 73a of the spectral reflectance means 73.

Therefore, when the operation dial 74 is rotated, its rotation is transmitted via the transmission shaft 75 to the revolving shaft 73a of the spectral reflectance means 73, rotating the spectral reflectance means 73. The operation dial 74 has written tags 74c thereon that show the characteristics of the different spectral reflectance materials that coat the various sheet-placement surfaces of the spectral reflectance means 73. When the tags 74c are brought to a particular position, the sheet-placement surface coated with the spectral reflective materials with the spectral reflectance properties shown on the tag is moved so as to face upward. The tag 74c of the operation dial 74, for example, when it shows "R", indicates the spectral reflectance material that reflects red light, and when it shows "C", indicates the spectral reflectance material that reflects the color cyan, which is a mixture of blue and green.

The explanation of the formation of a copied image by the use of this kind of sheet-exposure stand 70' is the same as for Example 4, so it is omitted.

EXAMPLE 6

Figure 13A:
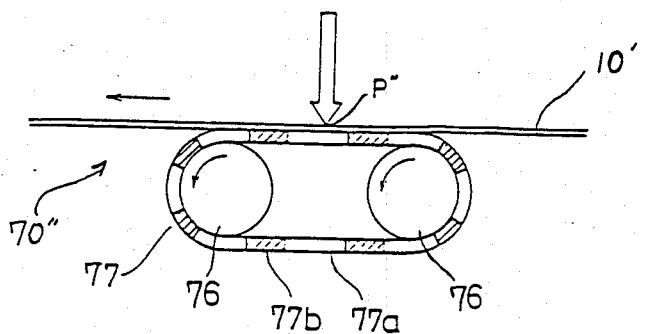
FIG. 13A is a side view showing the sheet-exposure stand of another apparatus of this invention.
Figure 13B:
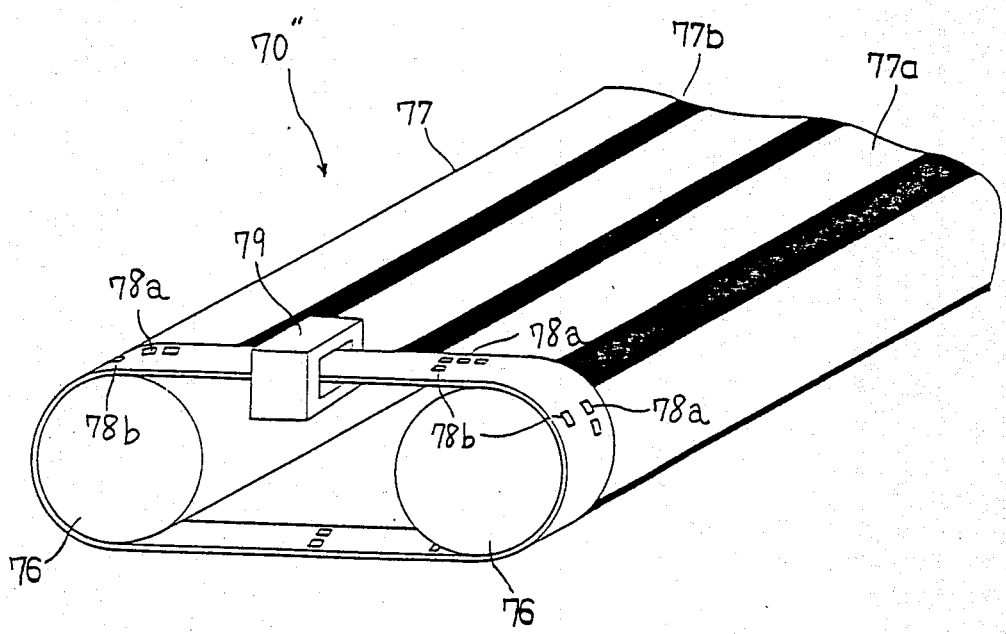
FIG. 13B is a perspective view showing the main portion of the sheet-exposure stand of FIG. 13A.
Figure 14:
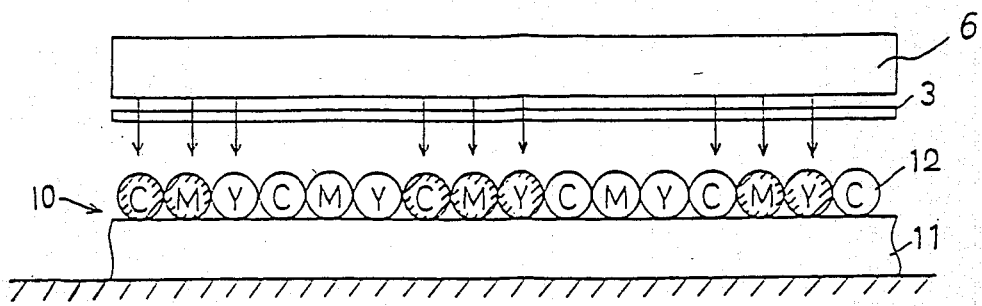
FIG. 14 is a diagram showing a conventional method for the formation of images.

FIGS. 13A and 13B show a sheet-exposure stand 70" in the shape of a belt. The belt-shaped sheet-exposure stand 70" has a pair of revolving rollers 76, around which the sheet-placement belt 77 is wrapped. One of the two revolving rollers 76 is rotated by a motor (not shown) so as to move the sheet-placement belt 77. The outside surface of the sheet-placement belt 77 is the sheet-placement surface, and this sheet-placement surface is provided with a spectral reflective part 77a that is coated with spectral reflective materials and with a light-absorbtive part 77b that is coated with a black material that absorbs light in alternate stripes in the long direction. Each of the spectral reflective parts 77a is coated with a spectral reflective material with different spectral reflective properties.

At one edge of the sheet-placement belt 77, there are holes 78a for the detection of the spectral reflective parts that correspond to the position of each spectral reflective part 77a. Also, there are holes 78b for the detection of the border between the spectral reflective parts 77a and the light-absorbing parts 77b. Each hole 78a for the detection of the spectral reflective part involves a specific number of holes, for example, each number of which corresponds to a particular spectral reflectance part 77a. A light-permeable light sensor 79 is disposed on one edge of the sheet-placement belt 77 along which these kinds of holes 78a for the detection of spectral reflectance parts and holes 78b for the detection of the position of the borders are provided. The light sensor 79 detects the holes 78a for the detection of the spectral reflectance parts and the holes 78b for the detection of the position of boundaries. Based on the results of the detection by the light sensor 79, the movement of the sheet-placement belt 77 is controlled so that the center portion of the desired spectral reflectance part 77a can be positioned at the exposure-point P. The meeting of the central portion of any of the spectral reflectance parts 77a with the exposure-point P is carried out by, for example, operation of the operating section that is disposed on the apparatus body 51.

The formation of a copied image by the use of this kind of a sheet-exposure stand 70" is the same as for Example 4, so the explanation is omitted here.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A sheet-exposure stand supporting a photosensitive sheet on its sheet-placement surface, said photosensitive sheet being composed of a light-permeable substrate that is coated with pressure-rupturable capsules that contain chromogenic materials and photosensitive materials that are hardened when illuminated with light, and said sheet-placement surface being coated with or made of a light-reflective substance.

2. A sheet-exposure stand according to claim 1, wherein said sheet-placement surface of the stand has spectral reflectivity properties that correspond to the wavelengths of light to which any one of the photosensitive materials is photosensitive.

3. A sheet-exposure stand according to claim 1, wherein said sheet-exposure stand has a single or plural sheet-placement surfaces that have different kinds of spectral reflectivity properties.

4. A sheet-exposure stand according to claim 1, wherein said sheet-exposure stand has sheet-placement surfaces that can be changed selectively, so that the sheet-placement surface selected has the desired spectral reflectivity properties.

5. A sheet-exposure stand according to claim 1, wherein said pressure-rupturable capsules contain photosensitive materials that are photosensitive to different wavelengths of light.

6. A sheet-exposure stand according to claim 1, wherein each of said chromogenic materials contained in said pressure-rupturable capsules gives rise to a color that is a complementary color to the color of the light of the wavelength to which said photosensitive materials contained in said pressure-rupturable capsules are photosensitive.

7. A method for the formation of images comprising placing a photosensitive sheet on the sheet-placement surface of a light-reflective stand that is light-reflective, said photosensitive sheet being composed of a light-permeable substrate that is coated with pressure-rupturable capsules that contain chromogenic materials and photosensitive materials that are hardened when illuminated with light; exposing said photosensitive sheet to light from or through a given image of the manuscript; placing said photosensitive sheet on an image-receiving sheet that is coated with developing materials so that said pressure-rupturable capsules of said photosensitive sheet can be brought into contact with said developing materials of said image-receiving sheet; and applying pressure to said two sheets.

8. A method according to claim 7, wherein said pressure-rupturable capsules contain photosensitive materials that are photosensitive to different wavelengths of light.

9. A method according to claim 7, wherein each of said chromogenic materials contained in said pressure-rupturable capsules gives rise to a color that is a complementary color to the color of the light of the wavelength to which said photosensitive materials contained in said pressure-rupturable capsules are photosensitive.

10. A method according to claim 7, wherein said sheet-placement surface of the stand has spectral reflectivity properties that correspond to the wavelengths of light to which any one of the photosensitive materials is photosensitive.

11. An apparatus for the formation of images comprising a sheet-exposure stand on which a photosensitive sheet is placed, said photosensitive sheet being composed of a light-permeable substrate that is coated with pressure-rupturable capsules that contain a chromogenic material and photosensitive materials that are hardened when illuminated with light, wherein the sheet-placement surface of said sheet-exposure stand on which said photosensitive sheet is placed has light-reflecting properties.

12. An apparatus according to claim 11, wherein said pressure-rupturable capsules contain photosensitive materials that are photosensitive to different wavelengths of light.

13. An apparatus according to claim 11, wherein each of said chromogenic materials contained in said pressure-rupturable capsules gives rise to a color that is a complementary color to the color of the light of the wavelengths to which said photosensitive materials contained in said pressure-rupturable capsules are photosensitive.

14. An apparatus according to claim 11, wherein said sheet-placement surface of the stand has spectral reflectivity properties that correspond to the wavelengths of light to which any one of the photosensitive materials is photosensitive.

15. An apparatus according to claim 11, wherein said sheet-exposure stand has a single or plural sheet-placement surfaces that have different kinds of spectral reflectivity properties.

16. An apparatus according to claim 15, wherein said sheet-exposure stand has sheet-placement surfaces that can be changed selectively, so that the sheet-placement surface selected has the desired spectral reflectivity properties.

* * * * *